(12) United States Patent
Tsuri et al.

(10) Patent No.: US 8,941,271 B2
(45) Date of Patent: Jan. 27, 2015

(54) LINEAR MOTOR FOR LIFTING AND LOWERING SUCTION NOZZLE, AND ELECTRONIC COMPONENT MOUNTING APPARATUS

(75) Inventors: Kenji Tsuri, Shizuoka (JP); Tomoyoshi Utsumi, Shizuoka (JP)

(73) Assignee: Yamaha Hatsudoki Kabushiki Kaisha, Shizuoka-ken (JP)

( * ) Notice: Subject to any disclaimer, the term of this patent is extended or adjusted under 35 U.S.C. 154(b) by 308 days.

(21) Appl. No.: 13/610,640

(22) Filed: Sep. 11, 2012

(65) Prior Publication Data

US 2013/0181546 A1 Jul. 18, 2013

(30) Foreign Application Priority Data

Jan. 12, 2012 (JP) .................................. 2012-003865

(51) Int. Cl.
*H02K 41/02* (2006.01)

(52) U.S. Cl.
USPC ..................................... 310/12.19; 310/12.33

(58) Field of Classification Search
USPC ....................... 310/12.01, 12.19, 12.32, 12.33
See application file for complete search history.

(56) References Cited

U.S. PATENT DOCUMENTS

| 2009/0056114 A1 | 3/2009 | Kanai et al. |
| 2010/0296906 A1* | 11/2010 | Hanamura et al. ............ 414/737 |
| 2011/0025137 A1* | 2/2011 | Sakai .......................... 310/12.13 |
| 2011/0052348 A1 | 3/2011 | Hanamura et al. |

FOREIGN PATENT DOCUMENTS

| JP | 4731903 B2 | 7/2011 |
| KR | 10-2008-0109767 A | 12/2008 |
| KR | 10-2010-0098638 A | 9/2010 |
| WO | 2006068322 A1 | 6/2006 |

OTHER PUBLICATIONS

An Office Action; "Notice of Submission of Opinion," issued by the Korean Patent Office on Oct. 17, 2013, which corresponds to Korean Patent Application No. 10-2012-0110543 and is related to U.S. Appl. No. 13/610,640; with partial English translation.

* cited by examiner

*Primary Examiner* — Hanh Nguyen
(74) *Attorney, Agent, or Firm* — Studebaker & Brackett PC

(57) ABSTRACT

The linear motor includes: a frame; a slider having an mounting portion to allow the suction nozzle to be coupled thereto, wherein the slider is support by the frame in a movable manner in an up and down direction; a plurality of permanent magnets fixed to the slider while being aligned in the up and down direction; a spring member installed between the frame and a region of the slider spaced from the fixation position of the permanent magnets in the up and down direction, to bias the slider upwardly; a coil supported by the frame in such a manner as to be opposed to the permanent magnets; and an encoder supported by the frame in side-by-side relation with the coil in the up and down direction and adapted to detect a movement of the slider. The encoder and the spring member are arranged side-by-side in a horizontal direction.

8 Claims, 13 Drawing Sheets

LINEAR MOTOR FOR LIFTING AND LOWERING SUCTION NOZZLE, AND ELECTRONIC COMPONENT MOUNTING APPARATUS

BACKGROUND OF THE INVENTION

1. Field of the Invention

The present invention relates to a suction nozzle lifting and lowering linear motor for lifting and lowering a suction nozzle capable of suction-holding an electronic component, and an electronic component mounting apparatus having the linear motor.

2. Description of the Background Art

Heretofore, an electronic component mounting apparatus equipped with a suction nozzle capable of suction-holding an electronic component has been often used to mount electronic components onto a printed-wiring board. This type of electronic component mounting apparatus includes an electronic component supply section for reserving electronic components, a head unit having a plurality of suction nozzles, and a moving device for moving the head unit between the electronic component supply section and a printed-wiring board in a horizontal direction.

The head unit has a lifting and lowing device for moving each of the suction nozzles in an up and down direction. This lifting and lowing device is operable, during an operation of suction-holding an electronic component in the electronic component supply section from thereabove, to lower and lift each of the suction nozzle, and, during an operation of mounting the suction-held electronic component onto a printed-wiring board, to lower and lift each of the suction nozzle. A conventional lifting and lowing device includes a type as disclosed, for example, in JP 4731903 (hereinafter referred to as "Patent Document").

The conventional lifting and lowing device disclosed in the Patent Document uses a linear motor as a driving source. The linear motor is adapted to move a slider coupled to a suction nozzle in an up and down direction. The linear motor includes a position detecting sensor provided on an upper side of the slider, and a return spring provided on a lower side of the slider. The position detecting sensor is designed to detect a position of the slider in the up and down direction. The return spring is designed to prevent the slider from moving downward by its own gravity, and installed to bias the slider upwardly.

The linear motor disclosed in the Patent Document has a problem of an increase in size in the up and down direction, because the position detecting sensor is located on the upper side of the slider, and the return spring is located on the lower side of the slider. Consequently, an electronic component mounting apparatus equipped with a suction nozzle lifting and lowering device using such a linear motor as a driving source will be increased in size in an up and down direction due to an increase in length of a head unit in the up and down direction.

SUMMARY OF THE INVENTION

It is an object of the present invention to provide a suction nozzle lifting and lowering linear motor downsized in an up and down direction, and an electronic component mounting apparatus having the linear motor.

In order to achieve this object, according to one aspect of the present invention, there is provided a linear motor for lifting and lowering a suction nozzle. The linear motor includes: a frame; a slider having an mounting portion provided at a lower end thereof to allow the suction nozzle to be coupled thereto, the slider being support by the frame in a movable manner in an up and down direction; a plurality of permanent magnets fixed to the slider while being aligned in the up and down direction; a spring member installed between the frame and a region of the slider spaced from the fixation position of the permanent magnets in the up and down direction, to bias the slider upwardly; a coil supported by the frame in such a manner as to be opposed to the permanent magnets; and an encoder supported by the frame in side-by-side relation with the coil in the up and down direction and adapted to detect a movement of the slider, wherein the encoder and the spring member are arranged side-by-side in a horizontal direction.

According to another aspect of the present invention, there is provided an electronic component mounting apparatus which includes: the above linear motor; a base; a printed-wiring board conveyance section for conveying a printed-wiring board on the base; a component supply section for supplying an electronic component; and a component transfer section including a head unit provided with a plurality of suction nozzles, wherein the component transfer section is operable to horizontally move the head unit so as to transfer the electronic component from the component supply section to the printed-wiring board, and wherein: the plurality of suction nozzles are aligned along a conveyance direction of the printed-wiring board; the head unit has a lifting and lowering device for lifting and lowering each of the suction nozzles by using the linear motor as a driving source; and the linear motor is disposed such that a horizontal direction perpendicular to the horizontal direction in which the encoder and the spring member are arranged side-by-side becomes parallel to the conveyance direction, and provided for each of the suction nozzles.

DESCRIPTION OF THE PREFERRED EMBODIMENTS

With reference to FIGS. 1 to 13, a suction nozzle lifting and lowering linear motor according to one embodiment of the present invention, and an electronic component mounting apparatus having the linear motor, will now be described in detail.

Figure 1:
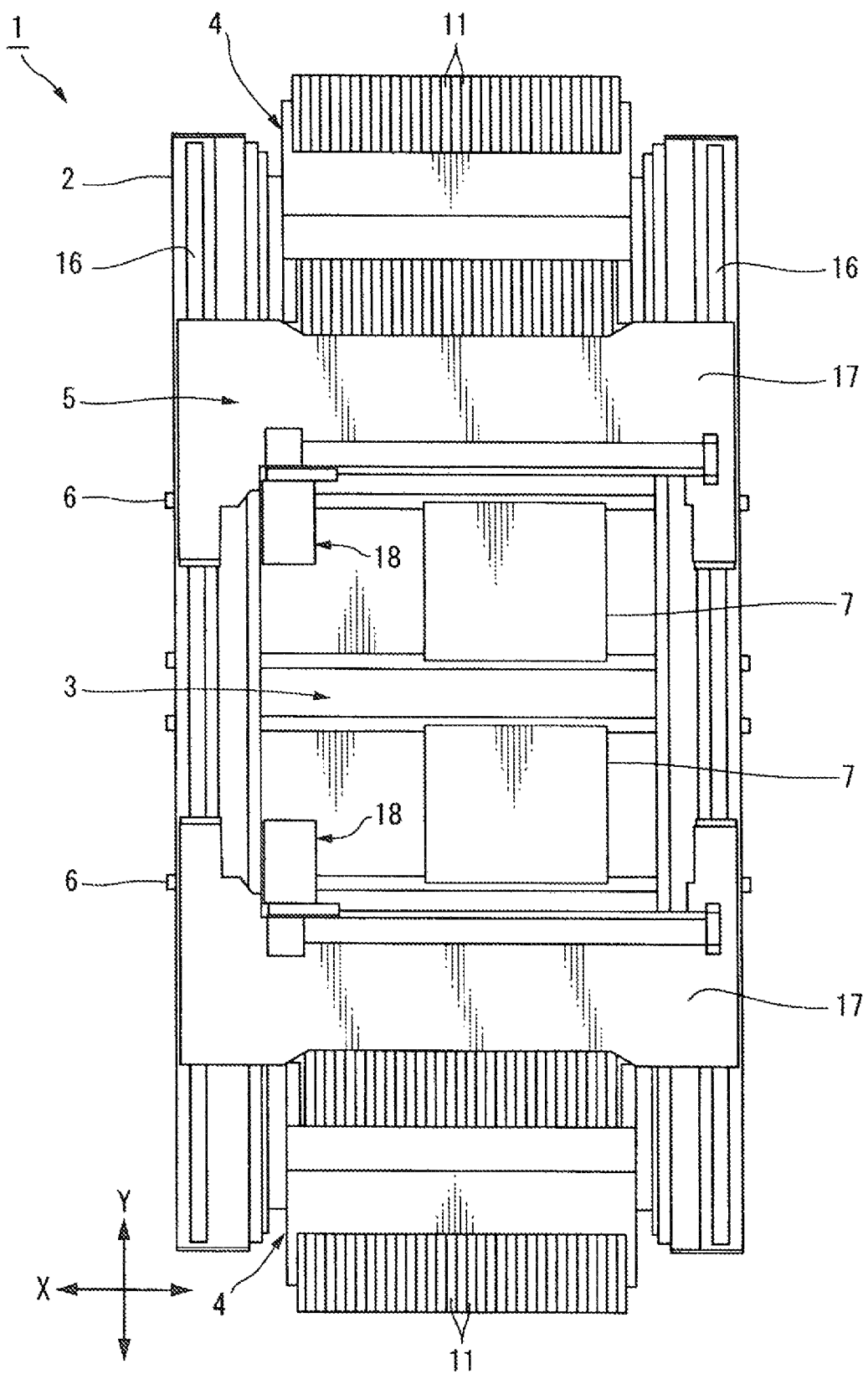
FIG. 1 is a top plan view illustrating a schematic configuration of an electronic component mounting apparatus according to one embodiment of the present invention.

An electronic component mounting apparatus 1 illustrated in FIG. 1 includes a base 2 having a rectangular shape in plan view, a printed-wiring board conveyance section 3 provided a central region of the base 2 in a longitudinal direction of the base 2, a pair of component supply sections 4 provided, respectively, in opposite end regions of the base 2 in the longitudinal direction, and a component transfer section 5 provided above the base 2. In this specification, the longitudinal direction of the base 2 will be referred to as "Y-direction". Further, a horizontal direction perpendicular to the Y-direction, i.e., a direction along with a printed-wiring board is conveyed by the printed-wiring board conveyance section 3 (a conveyance direction of a printed-wiring board), will be referred to as "X-direction".

The printed-wiring board conveyance section 3 is composed of two conveyer devices 6 arranged side-by-side in the Y-direction. Each of the conveyer devices 6 is designed to convey a printed-wiring board 7 in the X-direction. In this embodiment, each of the component supply sections 4 is composed of a plurality of tape feeders 11.

The component transfer section 5 includes a pair of Y rail units 16 provided, respectively, on opposite ends of the base 2 in the X-direction, two X rail units 17 each supported by the Y rail units 16 in an movable manner in the Y-direction, and a pair of head units 18 each supported by a respective one of the X rail units 17 in an movable manner in the X-direction. The component transfer section 5 is operable to move each of the head units 18 in the Y-direction so as to transfer an electronic component from a corresponding one of the component supply sections 4 to the printed-wiring board.

Figure 2:
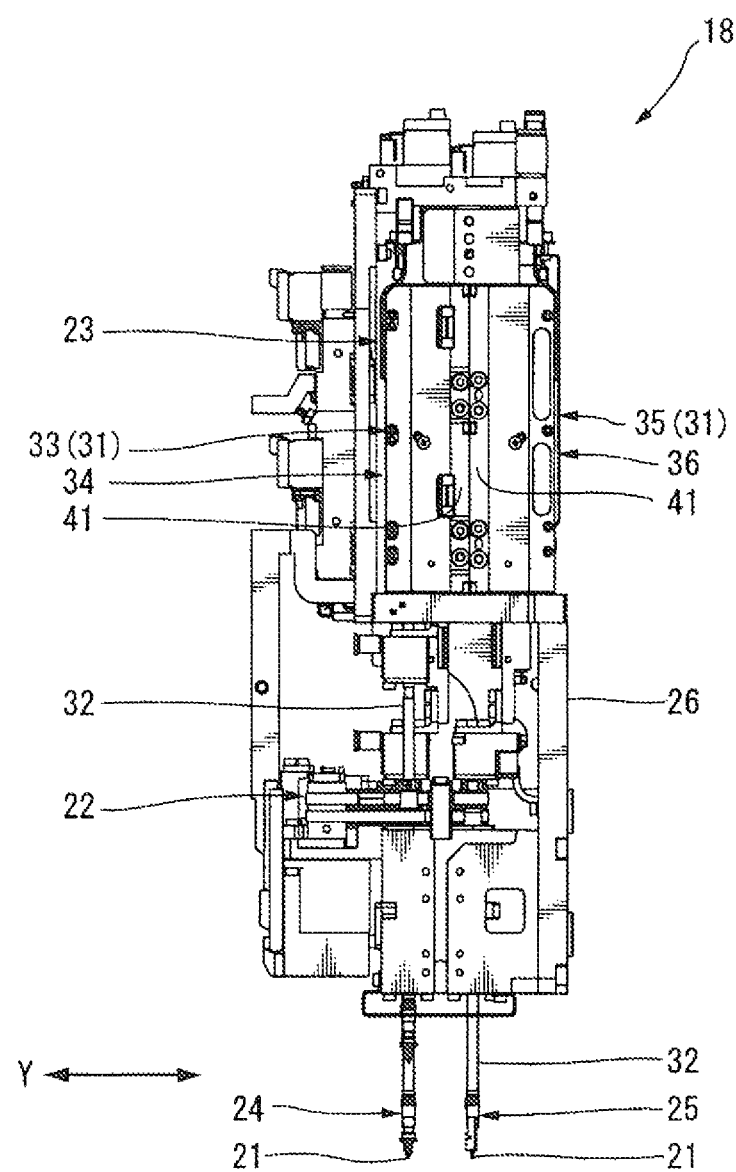
FIG. 2 is a side view of a head unit.
Figure 3:
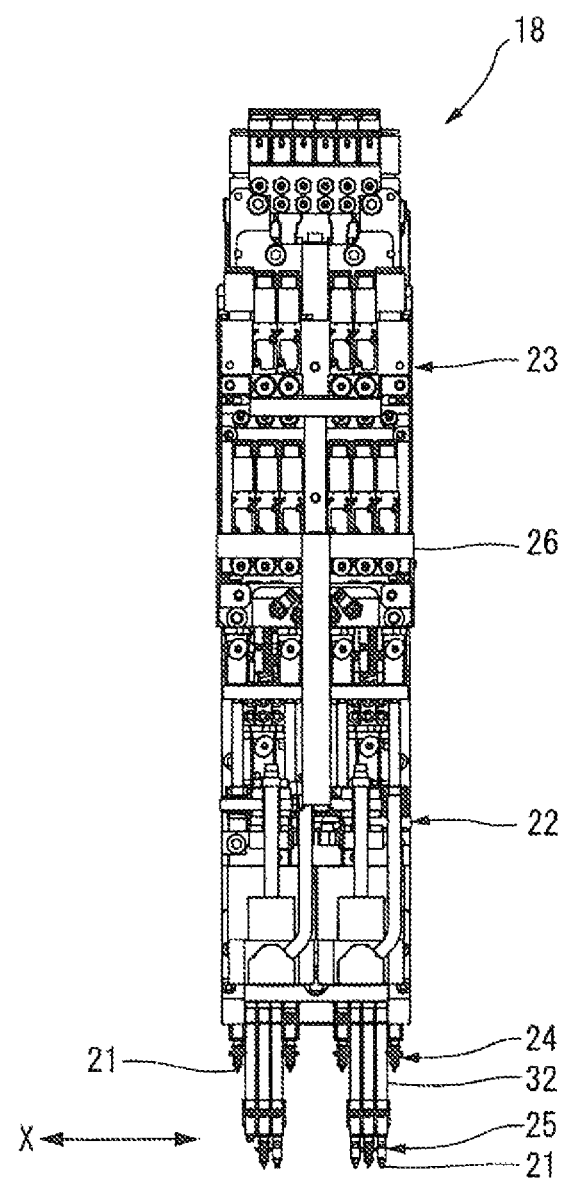
FIG. 3 is a front view of the head unit.

As illustrated in FIGS. 2 and 3, each of the head units 18 includes a plurality of suction nozzles 21, and a rotation device 22 and a lifting and lowering device 23 for driving the plurality of suction nozzles 21. As illustrated in FIGS. 2 and 3, the plurality of suction nozzles 21 are divided into two groups arranged side-by-side in the Y-direction, and two or more suction nozzles 21 in each of the groups are aligned in the X-direction. In other words, a first nozzle array 24 and a second nozzle array 25 each composed of two or more suction nozzles 21 aligned in the Y-direction are arranged side-by-side in the Y-direction.

In the two nozzle arrays 24, 25, the first nozzle array 24 located on a left side in FIG. 2 is composed of six suction nozzles 21 aligned in the X-direction (conveyance direction of the printed-wiring board), as illustrated in FIG. 3. The first nozzle array 24 is located on the side of a base end of the head unit 18 adjacent to the corresponding X rail unit 17. The second nozzle array 25 located on a right side in FIG. 2 is composed of four suction nozzles 21 aligned in the X-direction. Each of the suction nozzles 21 is supported by a support frame 26 of the head unit 18 in such a manner that it is rotatable about an up and down-wise axis thereof, and movable in the up and down direction.

The rotation device 22 is operable to rotate the suction nozzles 21 about the up and down-wise axis, individually. The lifting and lowering device 23 is operable to move the suction nozzles 21 in the up and down direction, individually.

The lifting and lowering device 23 is made up using, as a driving source, a suction nozzle lifting and lowering linear motor 31 according to one embodiment of the present invention. The linear motor 31 is provided for each of the suction nozzles 21, although details thereof will be discussed later. As illustrated in FIGS. 2 and 3, the lifting and lowering device 23 in this embodiment includes the plurality of linear motors 31 located at an upper end region thereof, and a plurality of coupling members 32 each extending downwardly from a respective one of the linear motors 31. The suction nozzles 21 are attached, respectively, to lower ends of the coupling members 32. Each of the coupling members 32 can be rotated according to driving of the rotation device 22.

Figure 4A:
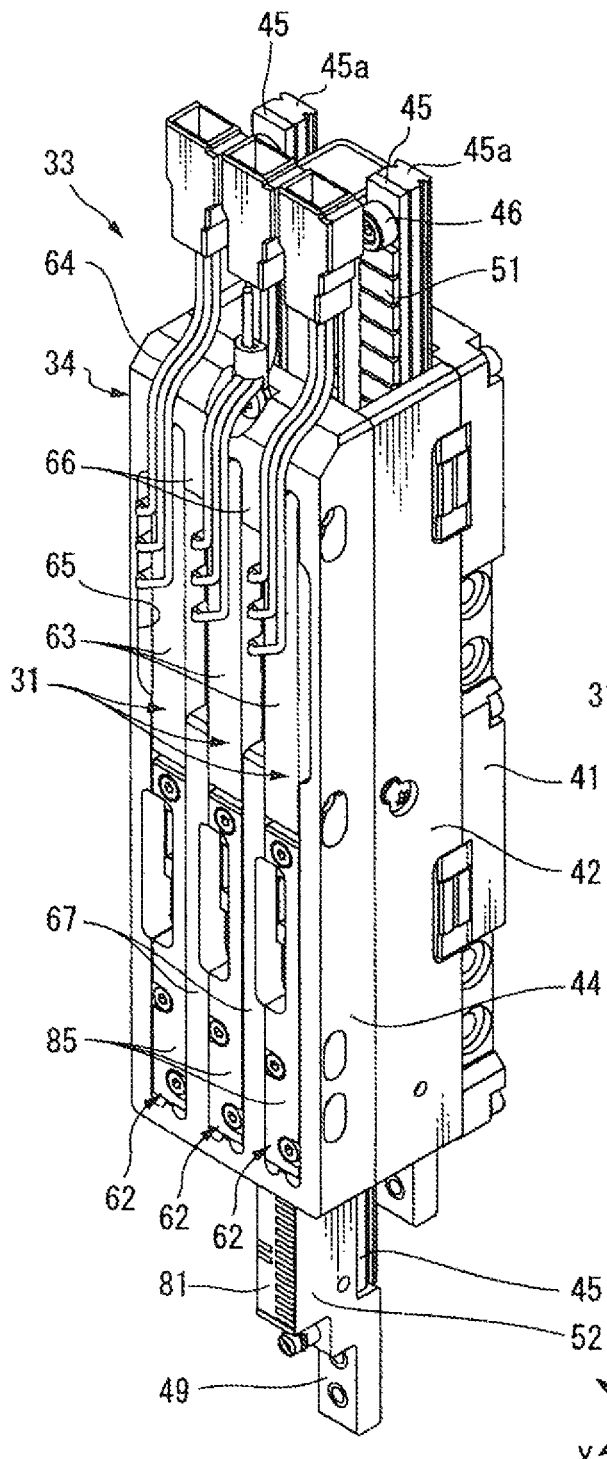
FIG. 4A is a perspective view of a first linear motor unit.

Among the plurality of suction nozzles 21, two or more suction nozzles 21 constituting the first nozzle array 24 are moved in the up and down direction by a first linear motor unit 33 illustrated in FIG. 4A. The first linear motor unit 33 is configured such that three linear motors 31 are supported by one frame 34. In this embodiment, the entire (six) suction nozzles 21 of the first nozzle array 24 are driven by a pair of the first linear motor units 33.

Figure 4B:
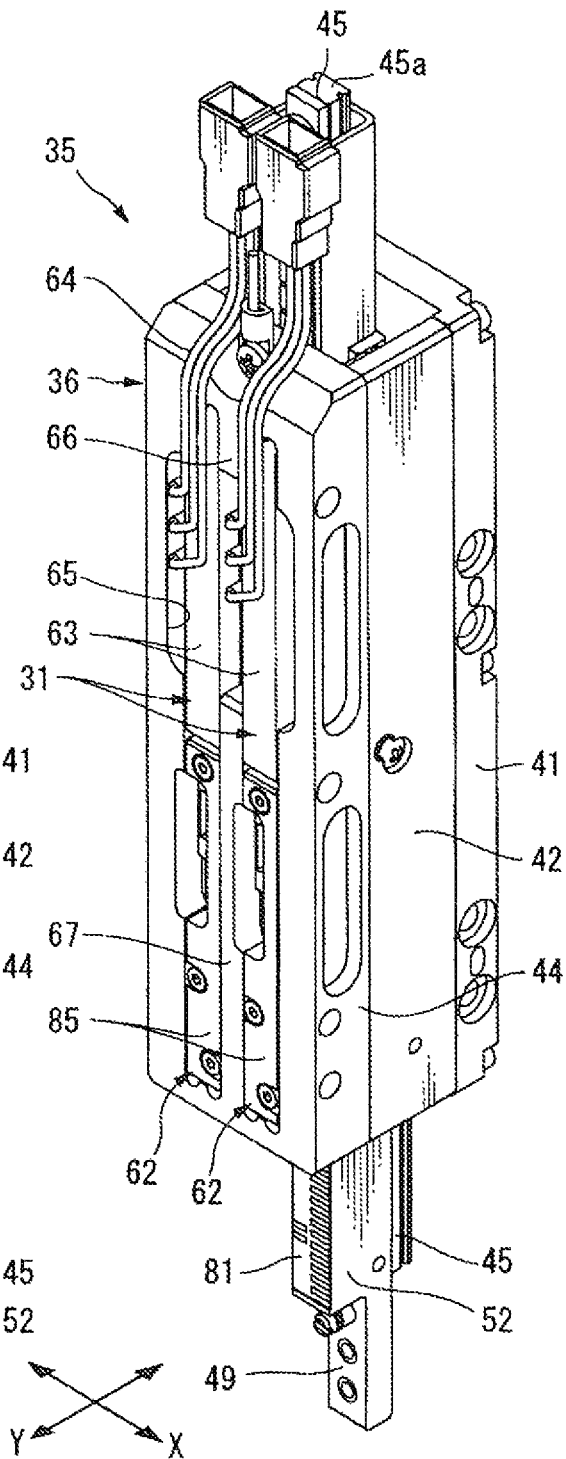
FIG. 4B is a perspective view of a second linear motor unit.

On the other hand, among the plurality of suction nozzles 21, two or more suction nozzles 21 constituting the second nozzle array 25 are moved in the up and down direction by a second linear motor unit 35 illustrated in FIG. 4B. The second linear motor unit 35 is configured such that two linear motors 31 are supported by one frame 36. In this embodiment, the entire (four) suction nozzles 21 of the second nozzle array 25 are driven by a pair of the second linear motor units 35.

Although the second linear motor unit 35 is different from the first linear motor unit 33 only in terms of the number of the linear motors 31, they are identical in the remaining configuration. Thus, in this specification, only the first linear motor unit 33 will be described, and detailed description of the second linear motor unit 35 will be appropriately omitted while assigning the same reference numeral or code to common elements or components in the figures.

Figure 5:
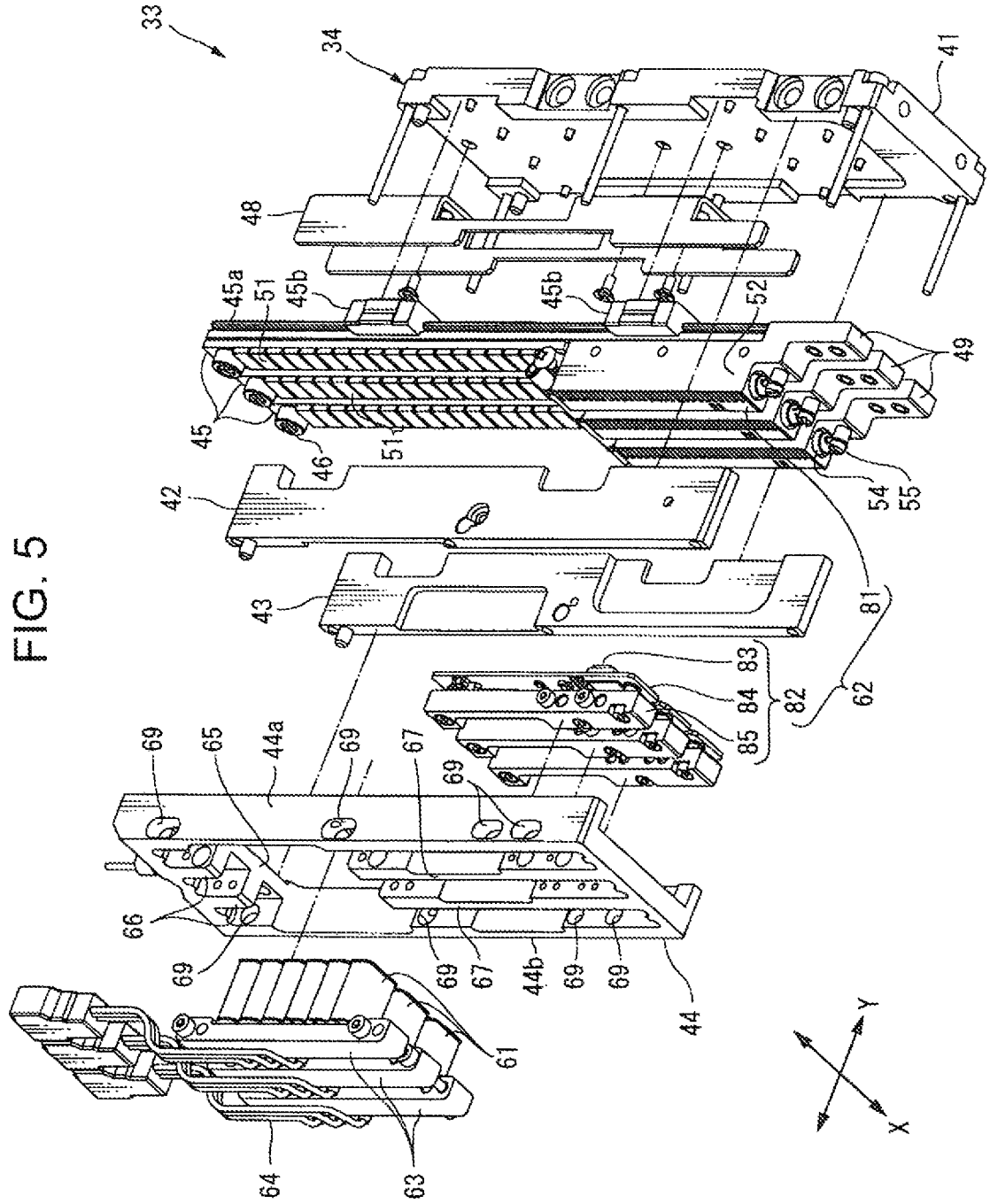
FIG. 5 is an exploded perspective view of the first linear motor unit.

As illustrated in FIG. 4A, the first linear motor unit 33 has a configuration in which a frame 34 is shared by three linear motors 31. The frame 34 is formed in a rectangular cylindrical shape by assembling a plurality of members together. As illustrated in FIG. 5, the frame 34 includes a first frame member 41 located at a right end in this figure, a pair of side plates 42, 43 each connected to a respective one of opposite side portions of the first frame member 41, and a second frame member 44 connected to the pair of side plates 42, 43 to be opposed to the first frame member 41.

The frame 34 is attached to the support frame 26 of the head unit 18, in a posture extending in the up and down direction, as illustrated in FIG. 2. The first linear motor unit 33 and the second linear motor unit 35 are attached to the support frame 26 of the head unit 18, to allow respective back surfaces of the first frame members 41 of the first and second linear motor units 33, 35 to be opposed to each other. The first frame member 41 is attached to the support frame 26 to extend in the up and down direction and the X-direction.

The first frame member 41 supports respective sliders 45 of the three linear motors 31 (see FIG. 5) in a movable manner in the up and down direction. Each of the sliders 45 is provided with a guide rail 45a, and supported by the first frame member 41 in a movable manner in the up and down direction through a support block 45b movably coupled to the guide rail 45a. The support body 45b is provided for each of the linear motors 31, and fixed to the first frame member 41, individually.

Figure 8:
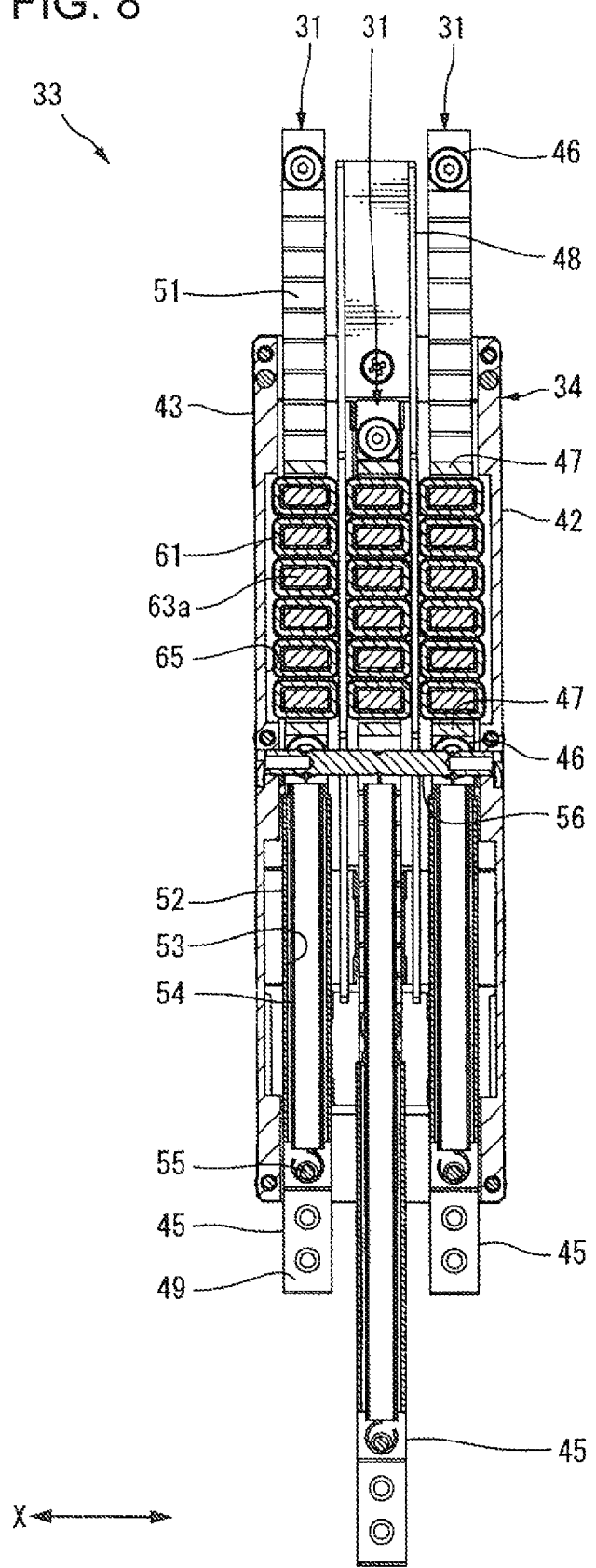
FIG. 8 is a sectional view taken along the line VIII-VIII in FIG. 6B.

A movable range of each of the sliders 45 in the up and down direction is restricted by two protrusion pieces 46 provided, respectively, in an upper end region and an up and down-wise central region (central region in the up and down direction) of the slider 45 (see FIGS. 5 and 8). Each of the protrusion pieces 46 protrudes from the slider 45 toward the second frame member 44. When the slider 45 is moved to a limit of the movable range, one of the protrusion pieces 46 is brought into contact with a corresponding one of two stoppers 47 provided on the second frame member 44, as illustrated in FIG. 8.

Figure 6A:
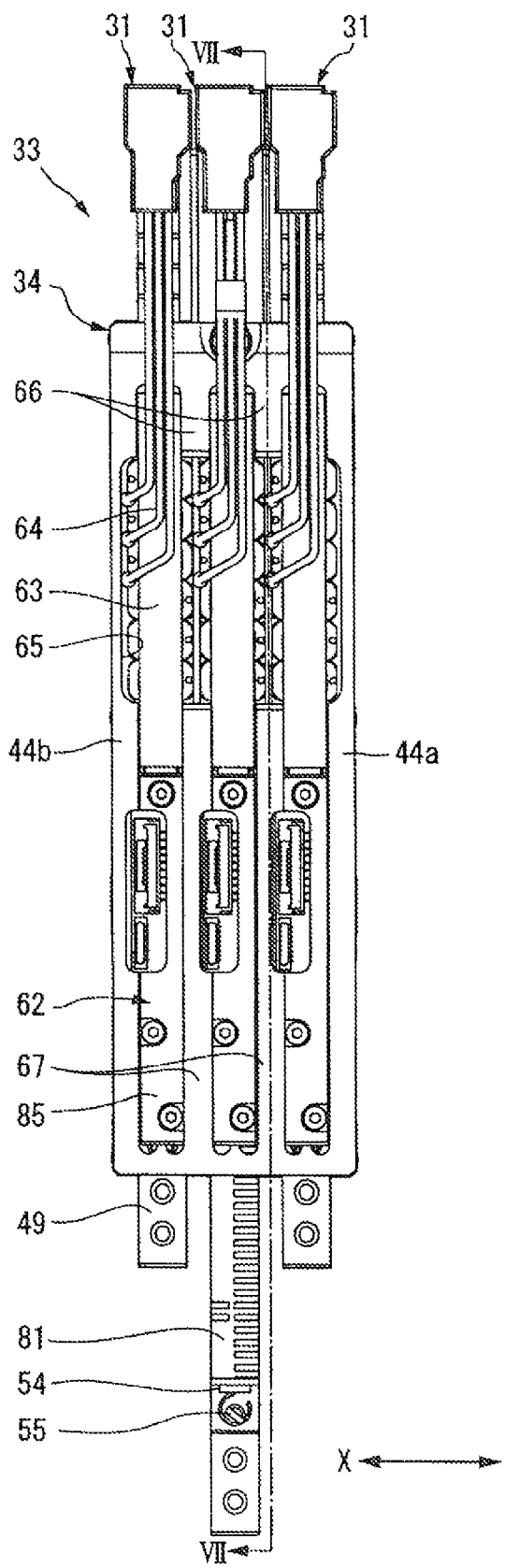
FIG. 6A is a front view of the first linear motor unit.
Figure 6B:
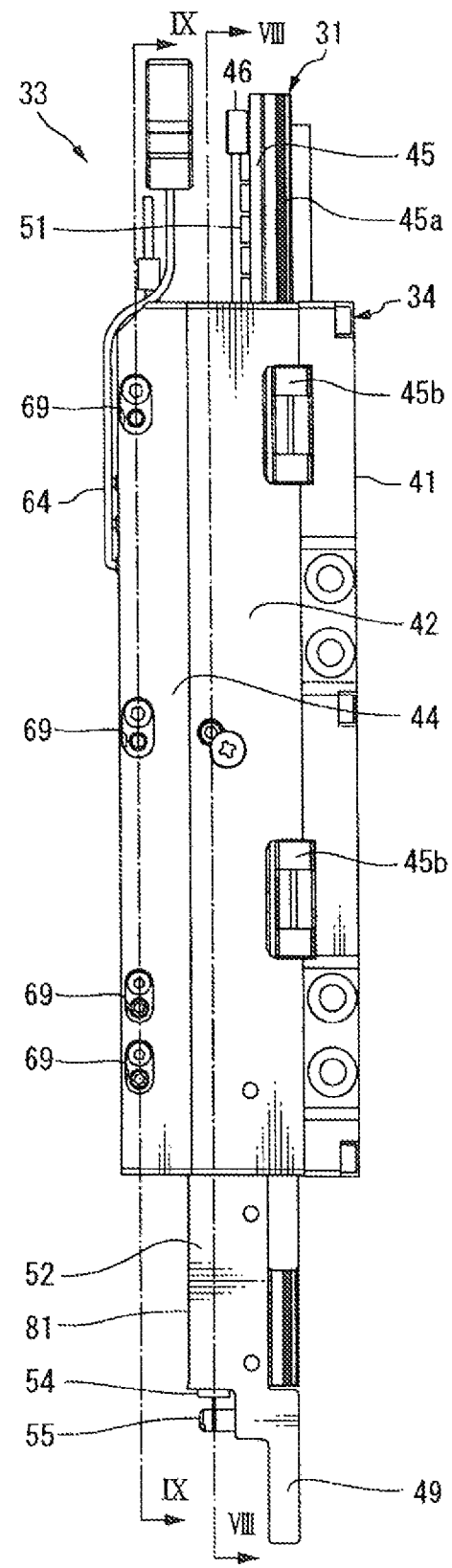
FIG. 6B is a side view of the first linear motor unit.
Figure 9:
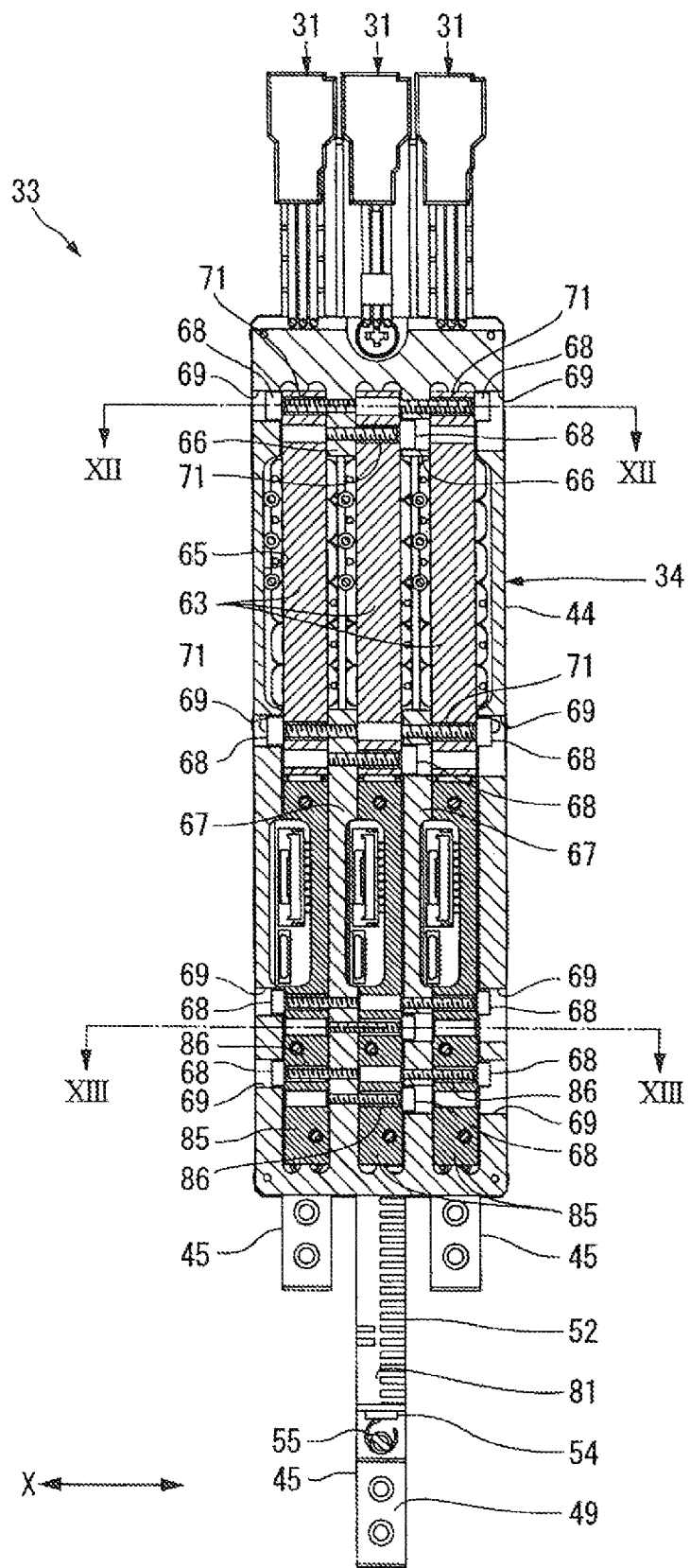
FIG. 9 is a sectional view taken along the line IX-IX in FIG. 6B.
Figure 12:
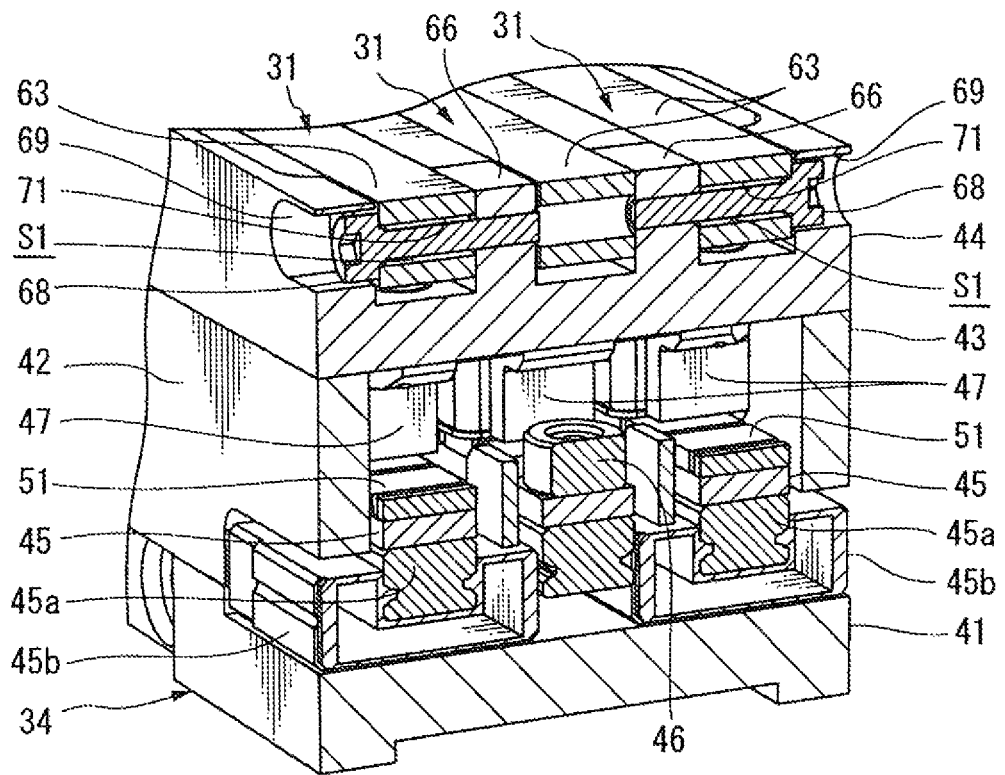
FIG. 12 is a perspective view illustrating an upper portion of the first linear motor unit in partial cutaway form, wherein the cut position is indicated by the line XII-XII in FIG. 9.
Figure 13:
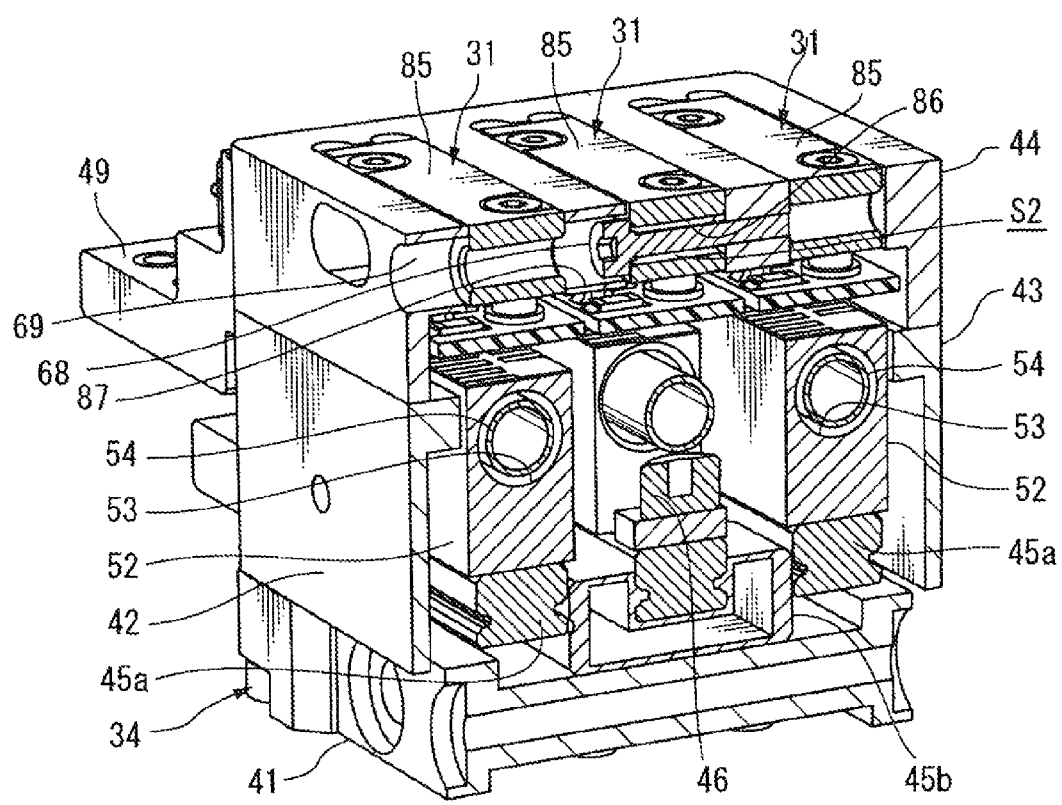
FIG. 13 is a perspective view illustrating a lower portion of the first linear motor unit in partial cutaway form, wherein the cut position is indicated by the line XIII-XIII in FIG. 9.

Among the three linear motors 31 illustrated in FIGS. 6, 8 and 9, the slider 45 of each of the two lateral linear motors 31 is depicted in a state in which it is moved upwardly to an upper limit position of the movable range. On the other hand, the slider 45 of the middle linear motor 31 is depicted in a state in which it is moved downwardly to a lower limit position of the movable range. As illustrated in FIG. 12, each of the stoppers 47 protrudes from an inner wall surface of the second frame member 44 toward the slider 45. The two stoppers 47 are provided for each of the linear motors 31, at respective positions around an upper end region and an up and down-wise central region of the second frame member 44.

In this embodiment, a length of the slider 45 in the up and down direction is set such that, even in a situation where the slider 45 is moved upwardly to the upper limit position, a lower end region of the slider 45 still protrudes downwardly from a lower edge of the frame 34.

The first frame member 41 is provided with a magnetic shielding plate 48 (see FIG. 5) for shielding leakage flux leaking from the linear motors 31. The magnetic shielding plate 48 is made of a ferromagnetic material having high permeability. The magnetic shielding plate 48 is attached to the first frame member 41, in a posture where it surrounds the slider 45 of the middle linear motor 31 from both sides thereof in the X-direction.

A lower end of each of the sliders 45 is provided with a mounting portion 49 for allowing a respective one of the suction nozzles 21 to be coupled thereto. Each of the coupling members 32 of the lifting and lowering device 23 is attached to a respective one of the mounting portions 49 to extend downwardly from the mounting portion 49. Each of the coupling members 32 to be attached to the first linear motor unit 33 is formed to extend vertically downwardly from a respective one of the mounting portions 49. Each of the coupling members 32 to be attached to the mounting portions 49 of the second linear motor unit 35 is formed to allow a respective one of the suction nozzles 21 to be located at a predetermined position in the X-direction.

Each of the sliders 45 is provided with a plurality of permanent magnets 51 fixed thereto. Each of the permanent magnets 51 has a quadrangular prism shape, and they are aligned in a line in the up and down direction at even intervals to form a permanent magnet array. In this embodiment, the array of the permanent magnets 51 is disposed on an upper region of one surface of the slider 45 on a side opposite to the first frame member 41.

The slider 45 has a quadrangular prism-shaped convex portion 52 formed on a lower portion thereof. The convex portion 52 protrudes in the horizontal direction (Y-direction) and in a direction opposite to a direction toward the first frame member 41. In this embodiment, the convex portion 52 is formed in a quadrangular prism shape which is long in the up and down direction, and a protruded end face thereof is formed as a flat surface. As illustrated in FIG. 8, the convex portion 52 is formed with a through-hole 53 penetrating therethrough in the up and down direction.

A tension coil spring 54 is inserted in the through-hole 53. The tension coil spring 54 is made of a non-magnetic material, and designed to bias the slider 45 upwardly. A spring force of the tension coil spring 54 is set to a level enough to prevent the suction nozzle 21 from moving downwardly in an undesirable manner when the linear motor 31 is in a non-energized state. It is noted that, in FIGS. 5 to 8, a coil portion of the tension coil spring 54 is depicted as a cylindrical shape for the sake of simplicity.

The tension coil spring 54 is installed between the frame 34, and a region of the slider 45 spaced from the fixation position of the permanent magnet array 51 in the up and down direction (in this embodiment, the lower end region of the slider 45). Specifically, the tension coil spring 54 is provided with a hook at a lower end thereof. The hook at the lower end is hooked to (engaged with) a support pin 55 (second pin) standingly provided on the lower end of the slider 45. The tension coil spring 54 is further provided with a hook at an upper end thereof. As illustrated in FIG. 8, the hook at the upper end is hooked to a support pin 56 (first pin) provided on the frame 34.

This support pin 56 is disposed between the side plates 42, 43 in the X-direction, at a position facing an upper end opening of the through-hole 53 of the convex portion 52, to support the upper end of the tension coil spring 54 for each of the linear motors 31. More specifically, the support pin 56 is located in a vicinity of a central region of the side plates 42, 43 in the up and down direction. The support pin 55 of the slider 45 is disposed at a position facing a lower end opening of the through-hole 53 of the convex portion 52.

Figure 7:
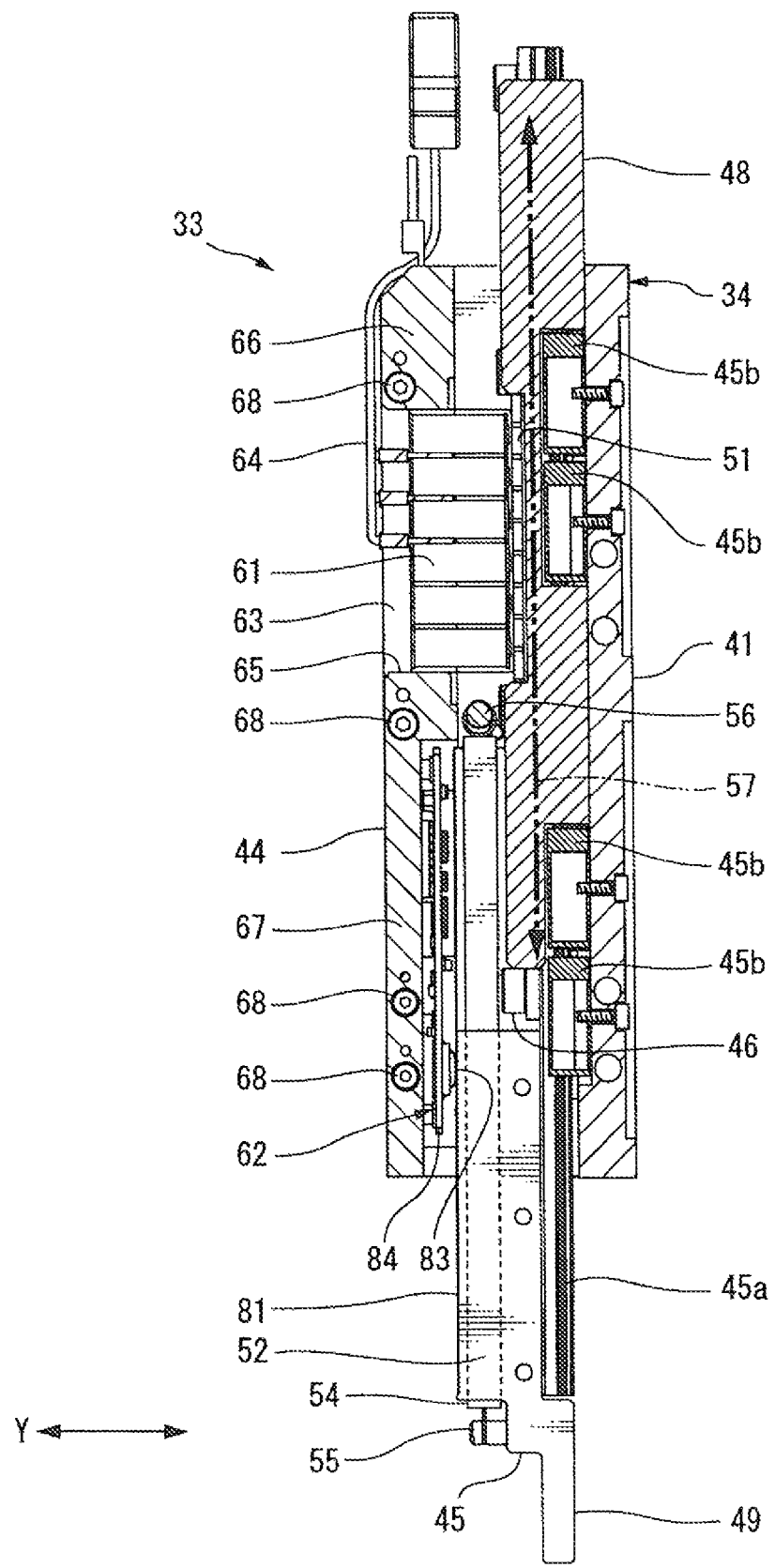
FIG. 7 is a sectional view taken along the line VII-VII in FIG. 6A.

As above, the tension coil spring 54 in this embodiment is provided between the lower end of the slider 45 and the vicinity of the up and down-wise central region of the frame 34, in a posture where it extends in the up and down direction. In other words, as illustrated in FIG. 7, the tension coil spring 54 is provided parallel to a movement path 57 (arrowed two-dot chain line) of the permanent magnets 51 to be moved along with a movement of the slider 45 in the up and down direction. In this embodiment, the tension coil spring 54 serves as "spring member" set forth in the appended claims.

The second frame member 44 is a frame for supporting an electric component of the linear motor 31. The electric component includes an array of coils 61 for generating a thrust, and an encoder 62 for detecting a movement of the slider 45. The coil array 61 and the encoder 62 are provided for each of the linear motors 31.

As illustrated in FIG. 5, the coil 61 is provided in a core 63, and supported by the second frame member 44 through the core 63 in such a manner as to be opposed to the permanent magnet array 51. A lead wire 64 of the coil array 61 is led toward a side opposite to the first frame member 41, and extended upwardly along the second frame member 44. The encoder 62 is supported by a lower portion of the second frame member 44 in side-by-side relation with the coil array 61 in the up and down direction.

The core 63 is formed in a comb-like shape having a plurality of teeth each serving as a magnetic pole penetrating through a respective one of the coils 61. The plurality of magnetic poles 63a are attached to the second frame member 44 in such a manner that they are directed toward the array of the permanent magnets 51, and aligned in the up and down direction to form magnetic pole array.

Figure 10:
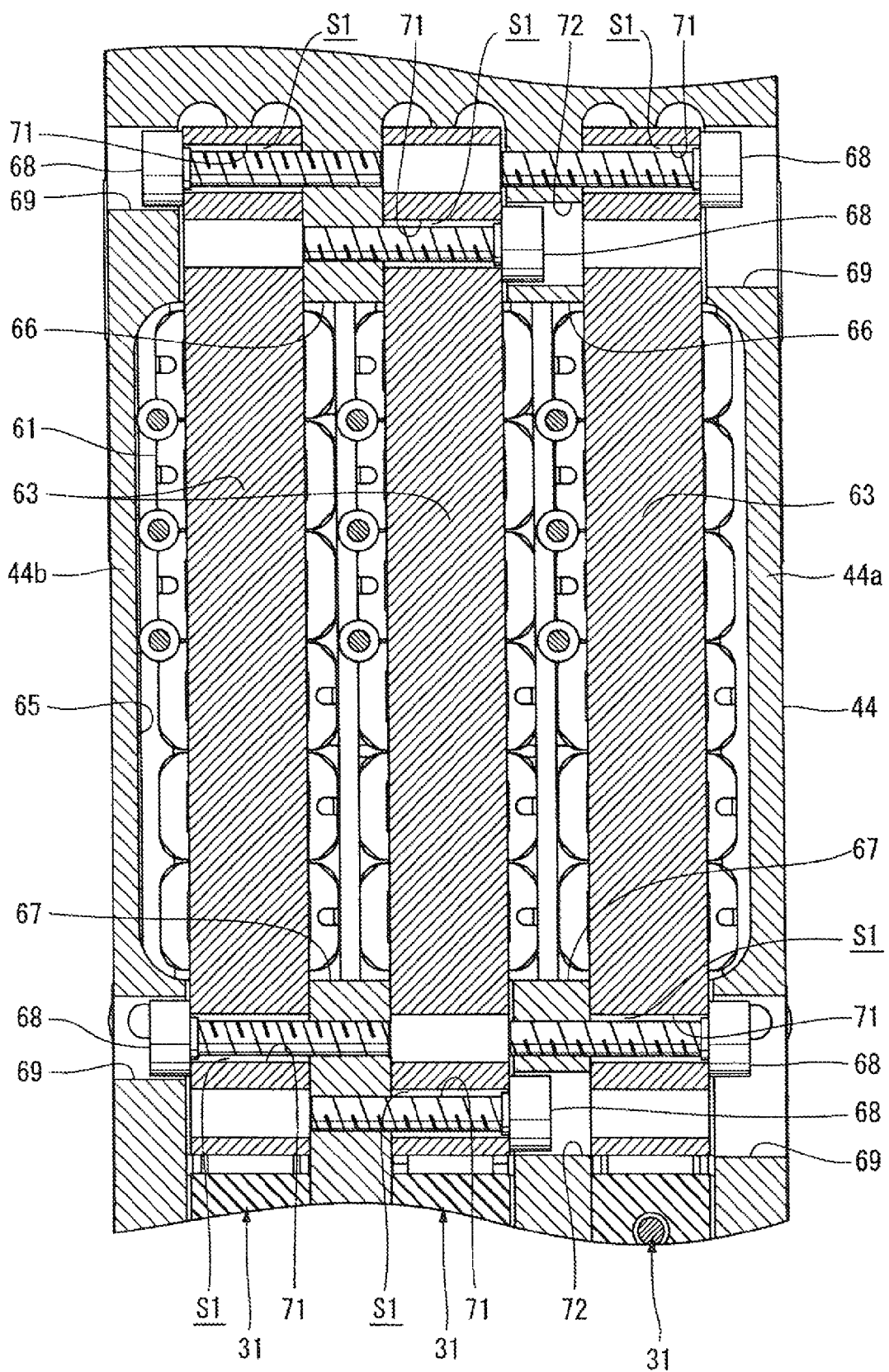
FIG. 10 is a sectional view enlargedly illustrating a region of the second frame member in FIG. 9 where a core is attached thereto.

As illustrated in FIGS. 5, 9 and 10, a region of the second frame member 44 where the three cores 63 are attached thereto comprises a through-hole 65 penetrating through an upper portion of the second frame member 44 in the Y-direction, two upper support plates 66 to which respective upper ends of the cores 63 are attached, and two lower support plates 67 to which respective lower ends of the cores 63 are attached.

Each of the upper support plates 66 extends downwardly from an upper end of the second frame member 44 to an upper edge of the through-hole 65. Each of the lower support plates 67 extends upwardly from a lower end of the second frame member 44 to a lower edge of the through-hole 65. Each of the upper support plates 66 and the lower support plates 67 is formed in a size insertable between adjacent ones of the cores 63 in the X-direction.

Further, as illustrated in FIG. 5, two sidewalls 44a, 44b of the second frame member 44 defining opposite ends thereof in the X-direction are formed with a plurality of through-holes 69 for allowing aftermentioned fixing bolts 68 (see FIG. 10) to be inserted thereinto. Each of the through-holes 69 penetrates through the sidewalls 44a, 44b in the X-direction. The through-hole 69 has a hole diameter capable of allowing a head of each of the aftermentioned fixing bolts 68 to be inserted thereinto.

As illustrated in FIG. 10, the upper ends of the three cores 63 are inserted, respectively, into a space defined between the sidewall 44a and one of the upper support plates 66, a space defined between the two of upper support plates 66, and a space defined between the other upper support plate 66 and the sidewall 44b, from the side opposite to the first frame member 41. Each of the cores 63 is fixed to a corresponding one of the upper support plates 66 by a fixing bolt 68 penetrating through the upper end of the core 63 in the X-direction. The fixing bolt 68 is inserted into a through-hole 71 penetrating through the upper end of each of the cores 63 in the X-direction, and screwed into the corresponding upper support plate 66. This through-hole 71 is formed to have a hole diameter greater than an outer diameter of the fixing bolt 68 to define a core position-adjusting gap S1 between the fixing bolt 68 and the through-hole 71. In other words, under a condition that the fixing bolt 68 is not tightly fastened to the upper support plate 66, the upper end of the core 63 can be moved with respect to the second frame member 44 by a distance corresponding to the gap S1.

The upper end of the core 63 provided in each of the two lateral linear motors 31 among the three linear motors 31 is fixed to a corresponding one of the upper support plates 66 by the fixing bolt 68 inserted into the through-hole 69 of a corresponding one of the sidewalls 44a, 44b in the X-direction from the outside of the second frame member 44. The upper end of the core 63 provided in the middle linear motor 31 among the three linear motors 31 is fixed to a corresponding one of the upper support plates 66 by the fixing bolt 68 inserted into the second frame member 44 through the through-hole 69 of the sidewall 44a before the cores 63 of the lateral linear motors 31 are attached. This fixing bolt 68 is inserted into a head-insertion through-hole 72 formed in one (in FIG. 9, a right one) of the two upper support plates 66, and the through-hole 71 of the core 63 of the middle linear motor 31, and screwed into the other upper support plate 66.

The fixing bolt 68 for fixing the core 63 of the middle linear motor 31 to the upper support plate 66 is located below the fixing bolt 68 for fixing the core 63 of each of the lateral linear motors 31 to the upper support plate 66.

The lower ends of the three cores 63 are inserted, respectively, into three spaces defined on the sides of the lower support plates 67, from the side opposite to the first frame member 41. As with the upper end of the cores 63, each of the cores 63 is fixed to an upper end of a corresponding one of the lower support plates 67 by a fixing bolt 68 penetrating through the lower end of the core 63 in the X-direction. A configuration for fixing the lower ends of the cores 63 to the lower support plates 67 is the same as the configuration for fixing the upper ends of the cores 63 to the upper support plates 66.

Specifically, the fixing bolt 68 for fixing the lower end of the core 63 provided in each of the two lateral linear motors 31, to a corresponding one of the lower support plates 67, is inserted into the through-hole 69 of a corresponding one of the sidewalls 44a, 44b and a through-hole 71 of the core 63, from the outside of the second frame member 44, and screwed into the corresponding lower support plate 67. The lower end of the core 63 provided in the middle linear motor 31 is fixed to a corresponding one of the lower support plates 67 by the fixing bolt 68 inserted into the second frame member 44 through the through-hole 69 of the sidewall 44a before the cores 63 of the lateral linear motors 31 are attached. This fixing bolt 68 is inserted into a head-insertion through-hole 72 formed in one of the two lower support plates 67, and the through-hole 71 of the core 63 of the middle linear motor 31, and screwed into the other lower support plate 67. The through-hole 71 of the lower end of the core 63 is formed to have a hole diameter greater than an outer diameter of the fixing bolt 68.

The core 63 is attached to the second frame member 44 to define a predetermined air gap between the magnetic pole array 63a and the permanent magnet array 51. This air gap is formed by inserting a shim (not illustrated) between the magnetic pole array 63a and the permanent magnet array 51 during assembling of the core 63 to the second frame member 44, and then extracting the shim after the assembling of the core 63.

As illustrated in FIG. 5, the encoder 62 includes a detection target element 81 composed of a magnetic scale provided on a protruded end face of the convex portion 52, and an encoder body 82 supported by the second frame member 44 in such a manner as to be opposed to the detection target element 81 in the Y-direction. In other words, the encoder 62 and the tension coil spring 54 are arranged side-by-side in a horizontal direction (Y-direction), as illustrated in FIG. 7. This horizontal direction means the same Y-direction as the direction in which the permanent magnet array 51 and the coil array 61 are arranged side-by-side. The encoder 62 is supported by the second frame member 44 in side-by-side relation with the coil array 61 in the up and down direction. The encoder 62 in this embodiment is disposed just below the coil array 61.

As above, each of the three linear motors 31 of the first linear motor unit 33 in this embodiment is disposed such that a horizontal direction (a direction perpendicular to the drawing sheet of FIG. 7) perpendicular to the horizontal direction (Y-direction) in which the encoder 62 and the tension coil spring 54 are arranged side-by-side becomes parallel to the conveyance direction (X-direction). Each of the two linear motors 31 of the second linear motor unit 35 aligned in the X-direction is disposed in the same manner as that in each of the linear motors 31 of the first linear motor unit 33.

As illustrated in FIG. 5, the encoder body 82 includes a substrate 84 on which a detecting sensor 83 opposed to the detection target element 81 is mounted, and a quadrangular prism-shaped mount member 85 supporting the substrate 84. The substrate 84 is formed in a rectangular shape which is long in the up and down direction, and fixed to one side surface of the mount member 85 facing in the Y-direction to allow a principle surface thereof to become parallel to the detection target element 81.

The mount member 85 is formed in a quadrangular prism shape extending in the up and down direction. The three mount members 85 are inserted, respectively, into three spaces each just below a respective one of the cores 63, i.e., a space defined between the sidewall 44*a* and one of the lower support plates 67, a space defined between the two lower support plates 67 and a space defined between the other lower support plate 67 and the sidewall 44*b,* from the side of the first frame member 41. The same structure as the aforementioned structure for attaching the cores 63 to the second frame member 44 is employed as a structure for attaching the mount members 85 to the second frame member 44, as illustrated in FIG. 9.

Figure 11:
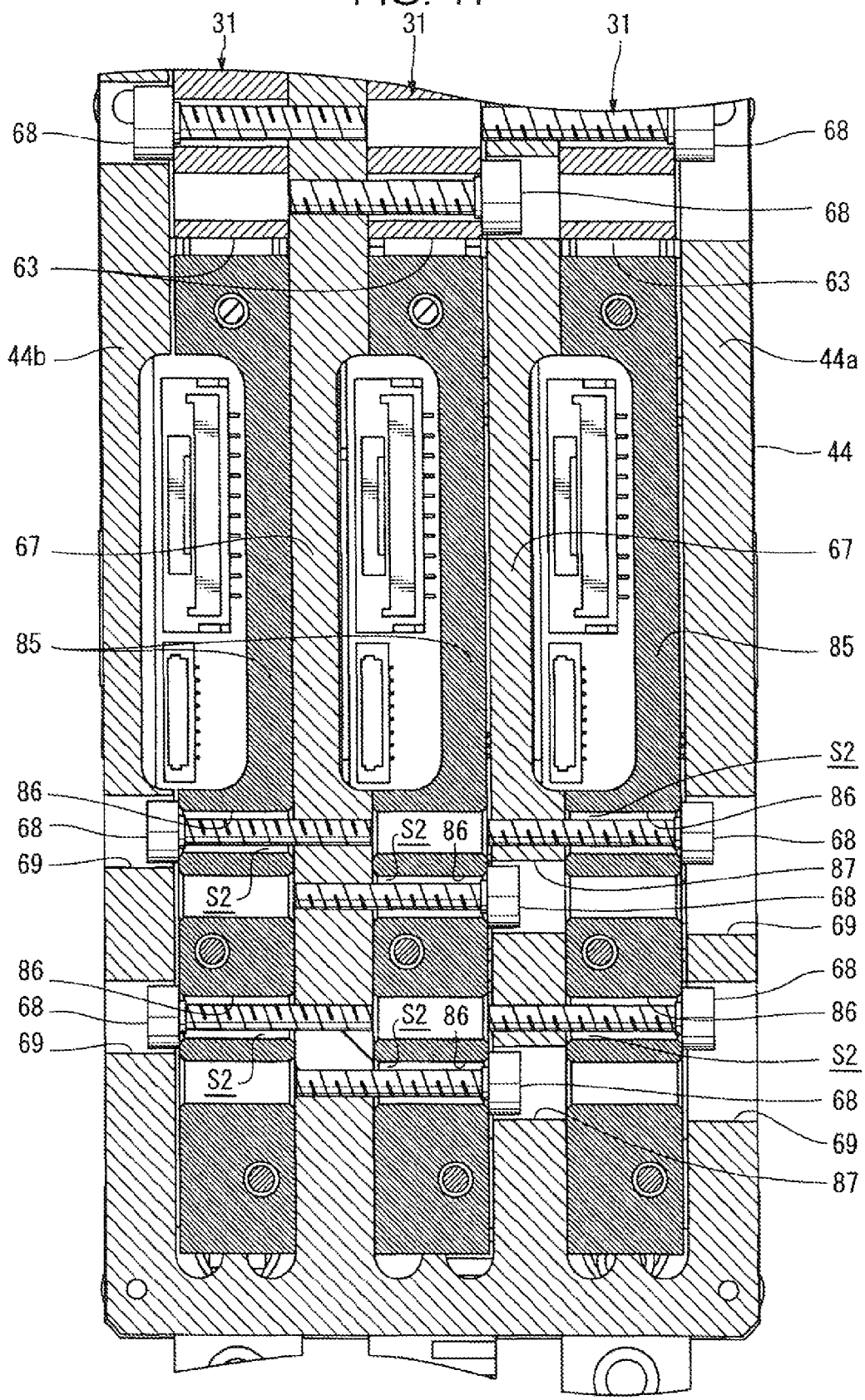
FIG. 11 is a sectional view enlargedly illustrating a region of the second frame member in FIG. 9 where an encoder mounting member is attached thereto.

As illustrated in FIG. 11, each of the mount members 85 has a lower portion formed with a plurality of through-holes 86 each extending in the X-direction to allow a fixing bolt 68 to be inserted thereinto. Each of the mount members 85 is fixed to a corresponding one of the lower support plates 67 by two fixing bolts 68. Each of the through-holes 86 is formed to have a hole diameter greater than an outer diameter of the fixing bolt 68 to define a sensor position-adjusting gap S2 between the fixing bolt 68 and the through-hole 86. In other words, under a condition that the fixing bolt 68 is not tightly fastened to the lower support plate 67, the mount member 85 (encoder body 82) can be moved with respect to the second frame member 44 by a distance corresponding to the gap S2. This allows the encoder body 82 to be supported by the frame 34 in such a manner that a distance between the detection target element 81 and the encoder body 82 is adjustable.

The mount member 85 in each of the two lateral linear motors 31 among the three linear motors 31 is fixed to a corresponding one of the lower support plates 67 by the fixing bolt 68 inserted into the through-hole 69 of a corresponding one of the sidewalls 44*a,* 44*b* in the X-direction from the outside of the second frame member 44.

The mount member 85 in the middle linear motor 31 is fixed to a corresponding one of the lower support plates 67 by the fixing bolt 68 inserted into the second frame member 44 through the through-hole 69 of the sidewall 44*a* before the mount members 85 of the lateral linear motors 31 are attached. This fixing bolt 68 is inserted into a head-insertion through-hole 87 formed in one of the two lower support plates 67, and the through-hole 86 of the mount member 85 of the middle linear motor 31, and screwed into the other lower support plate 67.

The encoder body 82 is attached to the second frame member 44 to define a predetermined air gap between the detecting sensor 83 and the detection target element 81. This air gap is formed by inserting a shim (not illustrated) between the detecting sensor 83 and the detection target element 81 during assembling of the encoder body 82 to the second frame member 44, and then extracting the shim after the assembling of the encoder body 82.

In the suction nozzle lifting and lowering linear motor 31 configured as above, the encoder 62 and the tension coil spring 54 are arranged side-by-side in a horizontal direction, and the horizontally-aligned components and the coil array 61 are arranged side-by-side in the up and down direction. Thus, this suction nozzle lifting and lowering linear motor 31 can be reduced in length in the up and down direction, as compared to the conventional linear motor in which the above three components are aligned in a line in the up and down direction. Therefore, the linear motor 31 according to the above embodiment can be provided as a suction nozzle lifting and lowering linear motor which is downsized in an up and down direction.

In the above embodiment, the tension coil spring 54 is made of a non-magnetic material. Further, the tension coil spring 54 is provided parallel to the movement path 57 of the permanent magnets 51 to be moved along with the movement of the slider 45 in the up and down direction. Thus, the tension coil spring 54 can be disposed adjacent to the slider 45. Therefore, even though the tension coil spring 54 is disposed in side-by-side relation with the slider 45 in a horizontal direction, the linear motor 31 according to the above embodiment can be provided as a suction nozzle lifting and lowering linear motor which is additionally downsized in the horizontal direction (Y-direction).

In the above embodiment, the slider 45 has the convex portion 52 protruding in the horizontal direction. The tension coil spring 54 is inserted in the through-hole 53 penetrating through the convex portion 52 in the up and down direction. The encoder 62 includes the detection target element 81 provided on the protruded end face of the convex portion 52, and the encoder body 82 supported by the frame 34. In the suction nozzle lifting and lowering linear motor 31 having the above feature, the encoder 62 and the tension coil spring 54 can be arranged adjacent to each other while preventing functional deterioration of the encoder 62. Thus, the linear motor 31 according to the above embodiment can be provided as a suction nozzle lifting and lowering linear motor which is downsized while maintaining high performance.

The electronic component mounting apparatus 1 using the linear motor according to the above embodiment includes the base 2, and the printed-wiring board conveyance section 3 for conveying the printed-wiring board 7 on the base 2. The electronic component mounting apparatus 1 further includes the component supply section 4 for supplying an electronic component, and the component transfer section operable to horizontally move the head unit 18 provided with the plurality of suction nozzles 21 so as to transfer the electronic component from the component supply section 4 to the printed-wiring board 7. The plurality of suction nozzles 21 are aligned in the conveyance direction of the printed-wiring board 7 (X-direction).

The head unit 18 has the lifting and lowering device 23 for lifting and lowering each of the suction nozzles 21 by using the suction nozzle lifting and lowering linear motor 31 as a driving source. The linear motor 31 is disposed such that a horizontal direction perpendicular to the horizontal direction (Y-direction) in which the encoder 62 and the tension coil spring 54 are arranged side-by-side becomes parallel to the conveyance direction (X-direction), and provided for each of the suction nozzles 21.

The linear motor 31 according to the above embodiment is configured such that a width thereof in a second horizontal direction (X-direction) perpendicular to a first horizontal direction (Y-direction) in which the tension coil spring 54 and the encoder 62 are arranged side-by-side becomes relatively narrow with respect to a width thereof in the first horizontal direction. Thus, the electronic component mounting apparatus 1 in the above embodiment can be provided as an electronic component mounting apparatus equipped with a head unit which is downsized not only in an up and down direction but also in a horizontal direction.

The linear motor 31 according to the above embodiment is configured such that the encoder 62 and the tension coil spring 54 are located just below the coils 61. However, the present invention is not limited to such a configuration. For example, the linear motor 31 of the present invention may be configured such that the encoder 62 and the tension coil spring 54 are located just above the coils 61. Further, a spring member for biasing the slider 45 upwardly is not limited to the aforementioned tension coil spring 54, but may be composed of a compression coil spring.

The above specific embodiment primarily includes inventions having the following features.

According to one aspect of the present invention, there is provided a linear motor for lifting and lowering a suction nozzle. The linear motor includes: a frame; a slider having an mounting portion provided at a lower end thereof to allow the suction nozzle to be coupled thereto, wherein the slider is support by the frame in a movable manner in an up and down direction; a plurality of permanent magnets fixed to the slider while being aligned in the up and down direction; a spring member installed between the frame and a region of the slider spaced from the fixation position of the permanent magnets in the up and down direction, to bias the slider upwardly; a coil supported by the frame in such a manner as to be opposed to the permanent magnets; and an encoder supported by the frame in side-by-side relation with the coil in the up and down direction and adapted to detect a movement of the slider, wherein the encoder and the spring member are arranged side-by-side in a horizontal direction.

In the linear motor of the present invention, the encoder and the spring member are arranged side-by-side in a horizontal direction, and the coil and a combination of the encoder and the spring member, i.e., substantially two components, are arranged side-by-side in the up and down direction. Thus, the linear motor of the present invention can be reduced in length in the up and down direction, as compared with the conventional linear motor in which the above three components are aligned in a line in the up and down direction. Therefore, in accordance with the present invention, it becomes possible to provide a suction nozzle lifting and lowering linear motor which is downsized in an up and down direction.

Preferably, in the linear motor of the present invention, the spring member is a coil spring made of a non-magnetic material, and the spring member is provided parallel to a movement path of the permanent magnets to be moved along with a movement of the slider in the up and down direction.

According to this feature, the spring member can be disposed adjacent to the slider. Therefore, even though the spring member is disposed in side-by-side relation with the slider in a horizontal direction, it becomes possible to provide a suction nozzle lifting and lowering linear motor which is additionally downsized in the horizontal direction (Y-direction).

Preferably, in the above linear motor, the slider has a convex portion protruding in the horizontal direction, the spring member is inserted in a through-hole penetrating through the convex portion in the up and down direction, and the encoder includes a detection target element provided on a protruded end face of the convex portion and an encoder body supported by the frame.

According to this feature, the spring member and the detection target element of the encoder can be installed by utilizing the convex portion provided on the slider, so that it becomes possible to efficiently lay out these components. In addition, the encoder and the spring member can be arranged adjacent to each other while preventing functional deterioration of the encoder. Thus, it becomes possible to provide a suction nozzle lifting and lowering linear motor which is downsized while maintaining high performance.

Preferably, in the above linear motor, the convex portion has a quadrangular prism shape which is long in the up and down direction, and the protruded end face of the convex portion is a flat surface, wherein the detection target element is a magnetic scale provided on the flat protruded end face. According to this feature, it becomes possible to more efficiently lay put the components.

Preferably, in the above linear motor, the frame includes a first frame supporting the slider in a movable manner in the up and down direction, a pair of side plates each connected to a respective one of opposite side portions of the first frame, a second frame connected to the pair of side plates in such a manner as to be opposed to the first frame, while supporting the coil and the encoder body, and a first pin disposed between the pair of side plates in a vicinity of a central region of the pair of side plates in the up and down direction; and the slider includes a second pin standingly provided on an lower end portion thereof, wherein: the first pin and the second pin are disposed at a position facing an upper end opening of the through-hole and a position facing a lower end opening of the through-hole, respectively; and an upper end and a lower end of the spring member are engaged with the first pin and the second pin, respectively.

According to this feature, it becomes possible to lay out the spring member between the frame and the slider in a compact manner.

According to another aspect of the present invention, there is provided an electronic component mounting apparatus which comprises: the above linear motor; a base; a printed-wiring board conveyance section for conveying a printed-wiring board on the base; a component supply section for supplying an electronic component; and a component transfer section including a head unit provided with a plurality of suction nozzles, wherein the component transfer section is operable to horizontally move the head unit so as to transfer the electronic component from the component supply section to the printed-wiring board, wherein: the plurality of suction nozzles are aligned along a conveyance direction of the printed-wiring board; the head unit has a lifting and lowering device for lifting and lowering each of the suction nozzles by using the linear motor as a driving source; and the linear motor is disposed such that a horizontal direction perpendicular to the horizontal direction in which the encoder and the spring member are arranged side-by-side becomes parallel to the conveyance direction, and provided for each of the suction nozzles.

The electronic component mounting apparatus of the present invention is equipped with the linear motor downsized in the up and down direction in the above manner, so that the head unit has a reduced height dimension. In addition, the linear motor is configured such that a width thereof in a first horizontal direction perpendicular to a second horizontal direction in which the spring member and the encoder are arranged side-by-side becomes narrower than a width thereof in the second horizontal direction. Thus, it becomes possible to provide an electronic component mounting apparatus equipped with a head unit which is downsized not only in an up and down direction but also in a horizontal direction.

This application is based on Japanese Patent application No. 2012-003865 filed in Japan Patent Office on Jan. 12, 2012, the contents of which are hereby incorporated by reference.

Although the present invention (disclosure) has been fully described by way of example with reference to the accompanying drawings, it is to be understood that various changes and modifications will be apparent to those skilled in the art. Therefore, unless otherwise such changes and modifications depart from the scope of the present invention (disclosure) hereinafter defined, they should be construed as being included therein.

What is claimed is:

1. A linear motor for lifting and lowering a suction nozzle, comprising:
   a frame;
   a slider having an mounting portion provided at a lower end thereof to allow the suction nozzle to be coupled thereto, the slider being support by the frame in a movable manner in an up and down direction;

a plurality of permanent magnets fixed to the slider while being aligned in the up and down direction;

a spring member installed between the frame and a region of the slider spaced from the fixation position of the permanent magnets in the up and down direction, to bias the slider upwardly;

a coil supported by the frame in such a manner as to be opposed to the permanent magnets; and an encoder supported by the frame in side-by-side relation with the coil in the up and down direction and adapted to detect a movement of the slider, wherein the encoder and the spring member are arranged side-by-side in a horizontal direction.

2. The linear motor as defined in claim 1, wherein:

the spring member is a coil spring made of a non-magnetic material; and the spring member is provided parallel to a movement path of the permanent magnets to be moved along with a movement of the slider in the up and down direction.

3. The linear motor as defined in claim 2, wherein:

the slider has a convex portion protruding in the horizontal direction;

the spring member is inserted in a through-hole penetrating through the convex portion in the up and down direction; and the encoder includes a detection target element provided on a protruded end face of the convex portion and an encoder body supported by the frame.

4. The linear motor as defined in claim 3, wherein;

the convex portion has a quadrangular prism shape which is long in the up and down direction, and the protruded end face of the convex portion is a flat surface; and the detection target element is a magnetic scale provided on the flat protruded end face.

5. The linear motor as defined in claim 3, wherein:

the frame includes a first frame supporting the slider in a movable manner in the up and down direction, a pair of side plates each connected to a respective one of opposite side portions of the first frame, a second frame connected to the pair of side plates in such a manner as to be opposed to the first frame, while supporting the coil and the encoder body, and a first pin disposed between the pair of side plates in a vicinity of a central region of the pair of side plates in the up and down direction; and the slider includes a second pin standingly provided on an lower end portion thereof, and wherein:

the first pin and the second pin are disposed at a position facing an upper end opening of the through-hole and a position facing a lower end opening of the through-hole, respectively; and an upper end and a lower end of the spring member are engaged with the first pin and the second pin, respectively.

6. An electronic component mounting apparatus comprising:

the linear motor as defined in claim 1;

a base;

a printed-wiring board conveyance section for conveying a printed-wiring board on the base;

a component supply section for supplying an electronic component; and a component transfer section including a head unit provided with a plurality of suction nozzles, the component transfer section being operable to horizontally move the head unit so as to transfer the electronic component from the component supply section to the printed-wiring board, wherein:

the plurality of suction nozzles are aligned along a conveyance direction of the printed-wiring board;

the head unit has a lifting and lowering device for lifting and lowering each of the suction nozzles by using the linear motor as a driving source; and the linear motor is disposed such that a horizontal direction perpendicular to the horizontal direction in which the encoder and the spring member are arranged side-by-side becomes parallel to the conveyance direction, and provided for each of the suction nozzles.

7. The electronic component mounting apparatus as defined in claim 6, wherein:

the spring member is a coil spring made of a non-magnetic material; and the spring member is provided parallel to a movement path of the permanent magnets to be moved along with a movement of the slider in the up and down direction.

8. The electronic component mounting apparatus as defined in claim 7, wherein:

the slider has a convex portion protruding in the horizontal direction;

the spring member is inserted in a through-hole penetrating through the convex portion in the up and down direction; and the encoder includes a detection target element provided on a protruded end face of the convex portion, and an encoder body supported by the frame.

* * * * *